United States Patent [19]

Brenner, Jr. et al.

[11] 4,337,304
[45] Jun. 29, 1982

[54] PROCESS FOR DISPOSING AN OPAQUE CONDUCTIVE BAND ON THE SIDEWALL OF A CRT PANEL

[75] Inventors: Kurt H. Brenner, Jr.; Arthur C. LaTulip, both of Seneca Falls, N.Y.; James E. Oetken, Winchester, Ky.

[73] Assignee: North American Philips Consumer Electronics Corp., New York, N.Y.

[21] Appl. No.: 234,983

[22] Filed: Feb. 17, 1981

[51] Int. Cl.³ .............................................. G03C 5/00
[52] U.S. Cl. ...................................... 430/24; 427/64; 430/28; 430/23; 430/25; 313/102; 313/461
[58] Field of Search ................. 430/23, 24, 28, 25; 427/64; 313/102, 461

[56] References Cited

U.S. PATENT DOCUMENTS

| | | | |
|---|---|---|---|
| 3,589,907 | 6/1971 | Dijkstra | 430/28 |
| 3,712,815 | 1/1973 | Rohrer et al. | 430/23 |
| 3,954,470 | 5/1976 | Barcynski et al. | 430/25 |
| 3,966,474 | 6/1976 | Harper | 430/23 |

Primary Examiner—Jack P. Brammer
Attorney, Agent, or Firm—Thomas A. Briody; Jack Oisher; John C. Fox

[57] ABSTRACT

The invention provides a multi-step photo-process for disposing a definitive band of opaque conductive material on the sidewall portion of a CRT face panel. The process provides coating the panel with a photosensitive material and discretely exposing the viewing area and terminal region of the sidewall to polymerize the material thereon. The intermediate unexposed coating is removed, and at least the sidewall portion, coated with an opaque conductive material. The polymerized coatings are degraded and removed, leaving a precisely defined band of opaque conductive material on the panel sidewall, and making electrical contact with the aperture mask supporting studs embedded therein.

4 Claims, 4 Drawing Figures

PROCESS FOR DISPOSING AN OPAQUE CONDUCTIVE BAND ON THE SIDEWALL OF A CRT PANEL

TECHNICAL FIELD

This invention relates to a process for disposing a definitive band of material on the sidewall portion of a CRT face panel and more particularly to the procedural steps for forming a defined band of opaque conductive material interiorly on the sidewall of the viewing panel to provide uniform opaque perimetrical framing for the viewing area thereof.

BACKGROUND OF THE INVENTION

Many currently-manufactured cathode ray tubes, such as those employed in color television and allied video applications, conventionally utilize patterned screens comprised of respective groups of related phosphor materials in conjunction with a windowed webbing evidencing an array of interstices. A color screen structure of this type is conventionally referred to as a matrix or composite screen.

While matrix screens provide enhanced color displays, there is, because of economic considerations, a demand for color cathode ray tubes having non-matrix screens, i.e., those wherein the patterned array of phosphor elements is utilized without the benefits of the interstitial webbing. Such screens were conventional before the advent of the matrix screen concept, and are less costly to produce.

In the manufacture of non-matrix screen CRT's, it is common practice to apply the patterned phosphor screen on the interior surface of the panel viewing area by conventional photo exposure techniques. This is followed by applying a thin film of lacquer over the back of the screen and the interior of the panel. Next, a thin layer of aluminum is vapor disposed thereover to provide a uniform conductive mirror-like covering of the screen and surrounding sidewalls of the panel. The aforementioned intermediate lacquer film, in addition to provide a substantially smooth surface for supporting the reflective aluminum, also prevents the aluminum from penetrating and poisoning the phosphor particles comprising the screen. The aluminized panel is then baked to remove the lacquer which is volatilized through the substantially porous structure of the aluminum. Thus, a conductive reflective coating is disposed on the back of the screen and the surrounding sidewalls of the panel.

In certain CRT applications, the tube is mounted in a manner whereby the panel portion projects slightly through an opening in the front of the display cabinet. This type of "push-through" mounting prominently exposes a peripheral screen-framing band of the sidewall disposed aluminum. Thus, in tubes intended for such utilization, it is aesthetically important that the aluminizing on the sidewall of the panel be free of noticeable and distracting blemishes. But, such quality is not always achieved since volatilization of the lacquer, during panel baking, sometimes results in blistering of the overlying aluminum film disposed on the glass sidewall areas. This undesired situation not only creates a poor cosmetic appearance and reduced conductivity, but also produces a potentially deleterious loose-particle problem within the tube.

In addition, in those tubes using a flexural contactor to accomplish electrical connection between the screen-related mask and the conductively coated sidewall of the panel, the sole thin layer of aluminum disposed thereon often proves to be an inadequate conductive medium. The mask-mounted flexural contactor pressured against the aluminum coating tends to cause abrasion thereof, producing pernicious metallic residue in the mask-screen region of the tube.

DISCLOSURE OF THE INVENTION

It is therefore an object of the invention to reduce and obviate the aforementioned disadvantages evidenced in the prior art. Another object of the invention is the provision of a process for disposing a defined and uniform band of opaque coating on the interior sidewall surface of a CRT panel. A further object of the invention is to provide a process for effecting a uniform band of substantially abrasion resistant conductive coating on the sidewall of the panel making electrical contact with the mask-supporting studs embedded therein.

These and other objects and advantages are accomplished in one aspect of the invention by providing a process whereby the cleaned interior of the CRT viewing panel is completely coated with a thin layer of a photosensitive material. The viewing area is subjected to a first defined exposure of radiant energy while shielding the sidewall portion therefrom. This flood of exposure energy provides continuous light-polymerization of the photosensitive coating on the viewing area. The next step involves a second defined polymerizing exposure directed only to the sensitized coating disposed on the peripheral terminal region of the sidewall, while peripheral shielding is effected for the major portion of the sidewall. The interior of the panel is then rinsed with a solvent to remove the band of unexposed and unpolymerized sensitized material existent on the panel sidewall between the two aforementioned exposed regions. After drying, at least the bare interior sidewall portion is coated with a uniform layer of an opaque conductive material. This is followed by treating the interior of the panel with a degrading agent to effect degradation of the polymerized material on the two exposed regions. A second rinsing of the panel removes the degraded polymerized material along with any opaque material overlaid thereon. The aforedescribed process provides a CRT face panel having a clean terminal region and a clear viewing area, while evidencing a precisely defined perimetrical band of opaque conductive material on the sidewall, peripherally framing the viewing area and extending toward the terminal region thereof.

BEST MODE FOR CARRYING OUT THE INVENTION

For a better understanding of the present invention together with other and further objects, advantages and capabilities thereof, reference is made to the following disclosure and appended claims taken in conjunction with the aforedescribed drawings.

The invention relates to a discrete process for treating CRT face panels which constitute the forward portions of the envelopes for tubes utilized in color television and related display applications. Panels of this type are individually comprised of a viewing area which is perimetrically surrounded by a skirt or sidewall portion. Conventionally, the sidewall contains an embedded plurality of aperture mask supporting studs.

It is important that the interior of the glass panel be clean. This is accomplished by washing the inner surface thereof with a suitable cleaner, such as a 5 to 10 percent aqueous solution of hydrofluoric acid, whereupon the panel is water rinsed.

Figure 1:
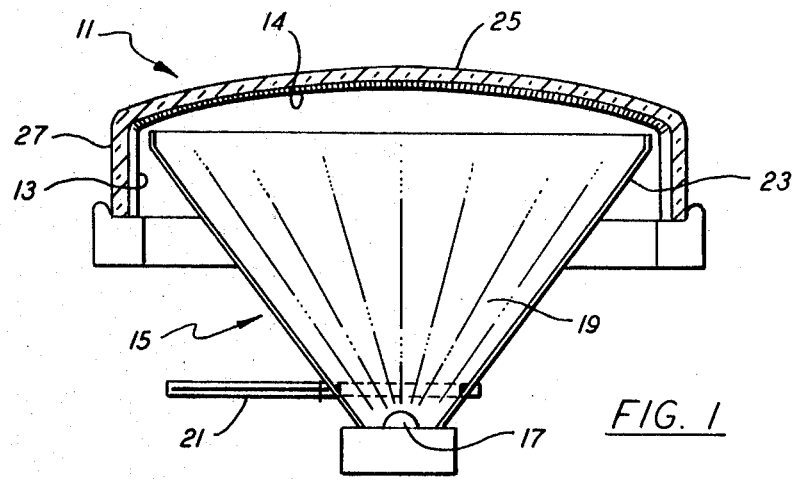
FIG. 1 is a cross-sectional view of the CRT face panel illustrating the first defined exposure of the photosensitive coating on the screen area.

With particular reference to FIG. 1, the interior of the clean panel 11 is then completely coated with a thin uniform layer of a photosensitive material 13, as for example, a substantially clear water-based polyvinyl alcohol (PVA) solution photosensitized with a chromate material, such as potassium or ammonium bi or dichromate. This type of sensitized material is commonly utilized in CRT screen formation.

The coated panel 11 is positioned on an exposure device 15, which is comprised of: a source radiant energy 17 emanating an unobstructed flood of actinic exposure radiation 19; a shutter control means 21, for limiting the period of exposure; and a discretely formed conical shielding means 23 for directing the exposure radiation to only the panel viewing area 25, while shielding the sidewall portion 27 therefrom. Thus, a clean cut peripheral edge is provided therearound. This first defined exposure step light polymerizes the complete expanse of photosensitive coating 14 disposed on the viewing area 25, such being substantially the subsequent screen area of the tube.

Figure 2:
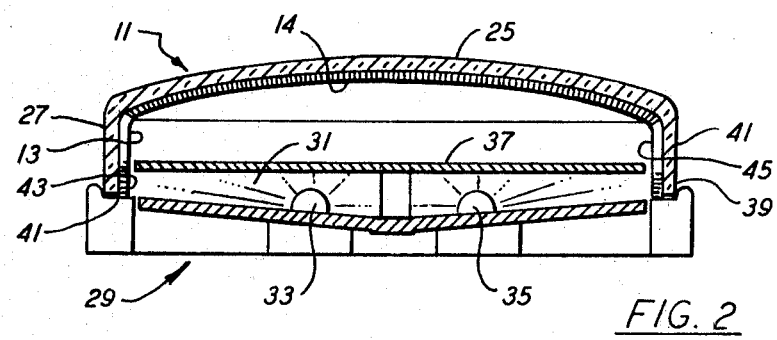
FIG. 2 is a similar sectional view of the panel showing the second defined exposure relating to the photosensitive coating on and adjacent to the terminal edge region of the panel.

The panel 11 is then positioned on another exposure device 29 as shown in FIG. 2. This device is of a type related to that disclosed in U.S. Pat. No. 4,021,819, and assigned to North American Philips Consumer Electronics Corp., New York, N.Y. The modified device utilized in this second defined exposure step, directs a flood of actinic exposure radiation 31 in a substantially lateral manner outward from radiant energy sources 33 and 35. This actinic exposure radiation is discretely confined, by a shield plate 37, to only a narrow perimetrical terminal-related region 39 of the panel sidewall 27, thereby providing a clean cut edge therearound. Both the major portion 41 of the sidewall and the already-exposed viewing area 25 are fully shielded from the second exposure radiation by the plate 37. Thus, by the second defined exposure only that photosensitive coating, disposed on the panel sealing edge 41 and the adjacent peripherally-related region 39 of the sidewall portion, is light transformed into a terminal banding of polymerized material 43. At this stage, the panel has two areas of polymerized coatings 14 and 43, separated by a sidewall banding 45 of the original unpolymerized photosensitive material 13.

The panel is next subjected to a first rinsing with a suitable solvent to remove the unexposed band 43 of photosensitive material from the sidewall. In this instance, a flow of water is employed to flush away the band of PVA material from the interior surface of the glass sidewall 27.

Figure 3:
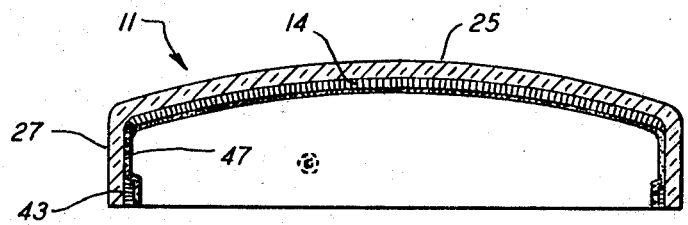
FIG. 3 is a cross-section of the panel detailing the two light-polymerized regions, and whereof the interior of the panel is overcoated with opaque material.

The interior of the panel, or at least the sidewall portion thereof, is then coated with a uniform layer of an opaque electrically conductive material 47, as illustrated in FIG. 3. An example of an efficient conductive coating material, that exhibits a beneficially hard surface, is formed from a colloidal graphite dispersion in substantially water and a water miscible alcohol. Such material is common in the art.

The panel is thence treated with a degrading agent to effect degradation of the polymerized materials 14 and 43 disposed on the respective viewing area 25 and the terminal peripherally-related region of the sidewall 39. In the case of degrading polymerized dichromated PVA, an exemplary agent is an aqueous solution of hydrogen perioxide. Such is known in the art and utilized in matrix screen fabrication. An effervescent reaction results which degrades the light-polymerized PVA areas 14 and 43 and loosens the associated graphite film contiguous thereon. The graphite coating disposed directly on the bare glass of the sidewall portion is not affected by the hydrogen peroxide treatment of the panel.

The interior of the panel is next subjected to a second rinsing with a suitable solvent to completely remove the degraded polymerized PVA and the overlying graphite coating associated therewith. In this instance, a flow of water is an efficient rinsing agent.

Figure 4:
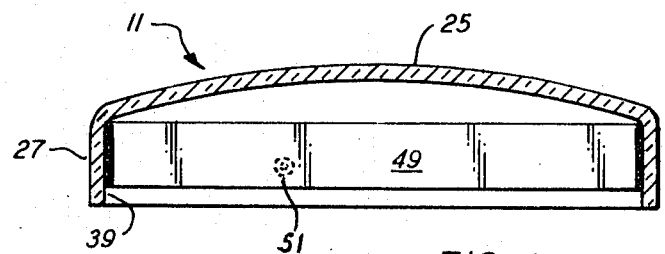
FIG. 4 is a sectional view of the panel after completion of the process wherein the defined band of coating is clearly evidenced.

The aforedescribed process provides an initially processed CRT face panel, as illustrated in FIG. 4, having a clean perimetrical terminal region 39 and a clear viewing area 25, while evidencing a precisely defined intermediate perimetrical band of opaque electrically conductive material 49 adheringly disposed on the major portion of the interior surface of the panel sidewall 27 between the viewing area and the terminal region, such coating making electrical contact with the mask mounting studs 51 therein. The panel, thus prepared and fabricated, is ready for the conventional non-matrix screening operation finalized with aluminizing of the interior of the panel.

INDUSTRIAL APPLICABILITY

The CRT face panel prepared by the described process, represents a marked advancement in tube quality by overcoming the disadvantages existent in the prior art. Panels so prepared exhibit uniform opaque framing of the screen area which is aesthetically pleasing, especially when tubes are mounted in "push-through" orientation. In addition, the precisely defined band of opaque conductive material adheres tightly to the panel sidewall, is not conductive to deleterious blistering and flaking, and provides a hard conductive surface for flexural contactors, when such are used. A further inherent advantage realized by the coating is the positive assurance of a good electrical connection with the sidewall-disposed aperture mask supporting studs. Thus, the quality and aesthetic shortcomings evidenced by the prior art single aluminized sidewall coating are advantageously eliminated by the process of the invention. The process is readily adaptable to tube manufacturing, the added cost being offset by markedly improved tube quality.

What is claimed is:

1. In a glass face panel for a non-matrix CRT having a viewing area peripherally defined by an integral skirtlike sidewall portion terminated by a continuous sealing edge therearound, a process for providing a completely clear viewing area while effecting a defined perimetrical band of black opaque conductive material on said sidewall bordering said viewing area and extending toward the region of said terminal edge and making electrical contact with the mask supporting studs embedded in said sidewall, said process comprising the steps of:

cleaning the interior of a CRT face panel;

completely coating the interior surface thereof with a thick layer of a photosensitive material;

making a first defined exposure of only the viewing area of said panel with an unobstructed flood of radiant energy while shielding said sidewall portion therefrom, said first exposure providing continuous light-polymerization of the photosensitive coating disposed on said viewing area;

effecting a second defined exposure of only the peripheral terminal region of said sidewall portion while peripherally shielding the major portion of said sidewall therefrom, said second exposure being effected by a flood of substantially laterally directed radiant energy to provide continuous polymerization of the photosensitive coating on the terminal peripherally-related region of said sidewall portion;

making a first rinsing of the interior of said panel with a solvent to remove the band of unpolymerized photosensitive material existent on said sidewall portion intermediate the two exposed and polymerized regions;

coating at least the interior sidewall portion of said panel with a uniform layer of an opaque electrically conductive material;

treating the interior of said panel with a degrading agent to effect degradation of the light-polymerized material on the viewing area and on the terminal region of said sidewall portion;

and effecting a second rinsing of the interior of said panel with a solvent to remove said degraded polymerized material thereby providing a panel having a clean perimetrical terminal region and a clear viewing area while evidencing a defined intermediate perimetrical band of opaque conductive material on the sidewall peripherally framing the viewing area and extending toward said terminal region.

2. The process for providing a defined perimetrical band of opaque conductive material on the sidewall of a CRT face panel according to claim 1 wherein said photosensitive material is water-based dichromate sensitized polyvinyl alcohol, and wherein said degrading agent is hydrogen peroxide, and wherein said rinsing solvents are water.

3. The process for providing a defined perimetrical band of opaque conductive material on the sidewall of a CRT face panel according to claim 1 wherein said defined first and second exposure steps are of substantially actinic radiant energy, and wherein said exposures are directed and shielded to provide clean-cut edges to said exposed areas.

4. The process for providing a defined perimetrical band of opaque conductive material on the sidewall of a CRT face panel according to claim 1 wherein said opaque conducting coating material is a colloidal graphite dispersion in substantially water and a water miscible alcohol.

* * * * *